US 6,560,264 B1

(12) United States Patent
Hayakawa

(10) Patent No.: US 6,560,264 B1
(45) Date of Patent: May 6, 2003

(54) STRIPE TYPE SEMICONDUCTOR LIGHT EMITTING ELEMENT HAVING INGAN ACTIVE LAYER, COMBINED WITH OPTICAL RESONATOR INCLUDING WAVELENGTH SELECTION ELEMENT

(75) Inventor: Toshiro Hayakawa, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 160 days.

(21) Appl. No.: 09/604,433

(22) Filed: Jun. 28, 2000

(30) Foreign Application Priority Data

Jun. 30, 1999 (JP) .............................. 11-185019
Apr. 20, 2000 (JP) ...................... 2000-119344

(51) Int. Cl.⁷ ............................................. H01S 3/10
(52) U.S. Cl. ..................... 372/92; 372/20; 372/29.02; 372/32
(58) Field of Search .......................... 372/46, 92, 98, 372/29.02, 20, 32

(56) References Cited

U.S. PATENT DOCUMENTS 5,123,024 A  *  6/1992  Dowd et al. .................. 372/38
5,949,804 A  *  9/1999  Okazaki ....................... 372/32
6,078,603 A  *  6/2000  Weegels et al. ............... 372/49

FOREIGN PATENT DOCUMENTS

JP    11-74559    3/1999    .......... H01L/33/00

OTHER PUBLICATIONS

Japanese Patent Abstract 11074559 Mar. 16, 1999.

* cited by examiner

Primary Examiner—James Davie
(74) Attorney, Agent, or Firm—Sughrue Mion, PLLC

(57) ABSTRACT

A semiconductor light emitting apparatus includes a semiconductor light emitting element which includes a stripe structure and an active layer made of an InGaN material, and emits first light without laser oscillation; an optical resonator; and a first wavelength selection unit which allows resonance, in the optical resonator, of second light having a selected wavelength included in the first light emitted by the semiconductor light emitting element. Alternatively, instead of the first wavelength selection unit, a second wavelength selection unit which allows output of only the above second light from the semiconductor light emitting apparatus may be provided. In this case, the semiconductor light emitting apparatus may further include an optical detector which detects intensity of the second light; and an output regularizing unit which drives the semiconductor light emitting element based on the detected intensity so as to regularize the intensity of the second light.

9 Claims, 5 Drawing Sheets

F I G . 4
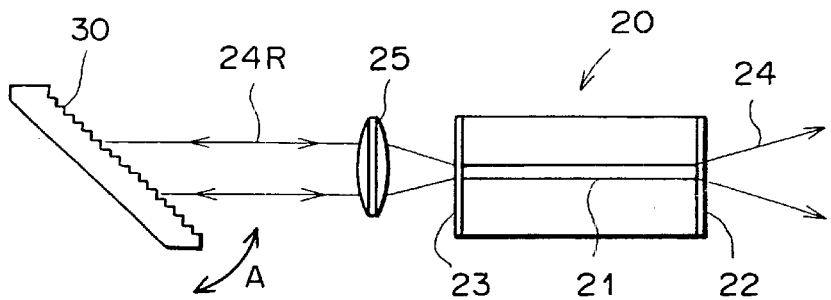
F I G . 5
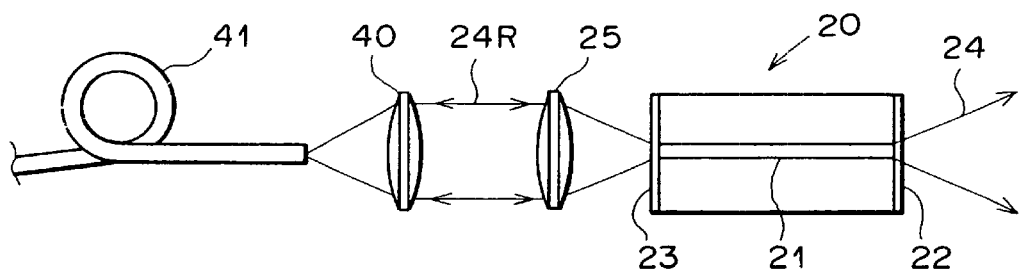
F I G . 6
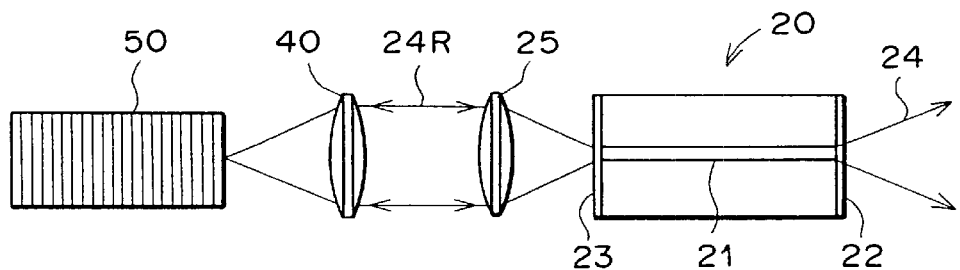
F I G . 7
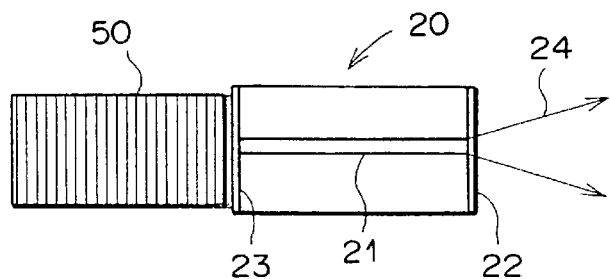

STRIPE TYPE SEMICONDUCTOR LIGHT EMITTING ELEMENT HAVING INGAN ACTIVE LAYER, COMBINED WITH OPTICAL RESONATOR INCLUDING WAVELENGTH SELECTION ELEMENT

BACKGROUND OF THE INVENTION

1. Field of the Invention

The present invention relates to a semiconductor light emitting apparatus using a semiconductor light emitting element which has an active layer made of an InGaN material and stripe structure, and in which laser oscillation does not occur.

2. Description of the Related Art

Conventionally, various optical-scanning color image printing apparatuses have been provided. Such apparatuses scan a sheet of color sensitive material with three color recording light beams so as to expose the sheet of color sensitive material to the three color recording light beams, and record a color image in the sheet of color sensitive material. These optical-scanning color image printing apparatuses can be broadly classified into two types. In the first type, the three color recording light beams are red, green, and blue light beams, and the usual color sensitive materials for exposure with visible light are used. In the second type, the above three color recording light beams are not red, green, and blue light beams, e.g., the three color recording light beams are in the wavelength range of red to infrared. In the second type of optical-scanning color image printing apparatuses, the three color recording light beams are respectively modulated based on image information on red, green, and blue components of the image, and three photosensitive layers having sensitivities in the wavelength ranges of the three color recording light beams are exposed to the three modulated color recording light beams, respectively.

The above first type of optical-scanning color image printing apparatuses have an advantage that the recording cost is low since the usual color sensitive materials are inexpensive and have stable characteristics. However, these type of optical-scanning color image printing apparatuses require light sources which can emit red, green, and blue laser beams, respectively. For downsizing and weight reduction, it is advantageous to use semiconductor laser devices as the light sources, rather than gas laser devices. Nevertheless, semiconductor laser devices emitting green and blue laser beams are not practically available at present.

In the above situation, Japanese Unexamined Patent Publication, No. 11-74559, which is assigned to the assignee of the present patent application, discloses a semiconductor light emitting element which can emit blue or green light, and realizes small spot emission and a narrow beam divergence angle. The semiconductor light emitting element disclosed in JPP11-74559 is a so-called superluminescent diode in which laser oscillation does not occur, although the disclosed semiconductor light emitting element has an active layer made of an InGaN material and stripe structure. Since the light emission area in the semiconductor light emitting element is confined in the stripe structure, the disclosed semiconductor light emitting element can emit green or blue light with a small beam diameter and a narrow beam divergence angle.

However, the conventional semiconductor light emitting devices have a drawback that the wavelength of emitted light is prone to vary due to characteristics of the InGaN material, as explained below.

When the relative composition of Indium in the InGaN active layer is increased, the energy gap is reduced, and accordingly the wavelength of light emitted from the InGaN active layer shifts to a longer wavelength side. Therefore, in order to realize emission of green or blue light, the relative composition of Indium in the InGaN active layer must be increased to a certain amount. However, the spatial nonuniformity of the Indium composition in the InGaN active layer increases with increase in the average relative composition of Indium. For example, when the active layer is excited by current injection, carriers move to low energy areas in which the Indium composition is relatively high, and energy relaxation and radiative recombination occur in the low energy areas. Nevertheless, since light emission occurs in the local area in this case, the volume contributing to the light emission is limited. Therefore, the more highly the InGaN active layer is excited, the more carriers flood into areas in which the Indium composition is relatively low. Consequently, the wavelength of the light emitted from the InGaN active layer shifts to a shorter wavelength side.

The above variation in the wavelength of the light emitted from the InGaN active layer is seriously disadvantageous to the aforementioned optical-scanning color image printing apparatuses. Since the color sensitive materials including silver halide photosensitive materials have spectral sensitivities, effective amounts of exposure vary as the wavelength of recording light varies, even if the intensity of the recording light does not vary.

As explained above, in the optical-scanning color image printing apparatuses, suppression of the wavelength variation in the recording light is important as well as control of the intensity of the recording light. In particular, the suppression of variations in the wavelength and intensity of the recording light is important in the color image printing apparatuses used in medical applications in which highly accurate gradation control is required.

SUMMARY OF THE INVENTION

An object of the present invention is to provide a semiconductor light emitting apparatus using a semiconductor light emitting element which includes stripe structure and an active layer made of an InGaN material, and emits light without laser oscillation, wherein variation in the wavelength of the light emitted from the semiconductor light emitting element can be effectively suppressed.

Another object of the present invention is to provide a semiconductor light emitting apparatus using a semiconductor light emitting element which includes stripe structure and an active layer made of an InGaN material, and emits light without laser oscillation, wherein variations in the wavelength and intensity of the light emitted from the semiconductor light emitting element can be effectively suppressed.

(1) According to the first aspect of the present invention, there is provided a semiconductor light emitting apparatus comprising: a semiconductor light emitting element which includes a stripe structure and an active layer made of an InGaN material, and emits first light without laser oscillation; an optical resonator combined in with said semiconductor light emitting element; and a wavelength selection means which allows resonance, in the optical resonator, of second light having a selected wavelength included in the first light emitted by the semiconductor light emitting element.

Since the optical resonator is combined with the semiconductor light emitting element, and the wavelength of the light which resonates in the optical resonator is locked to the selected wavelength by the provision of the wavelength selection means, the variation of the wavelength of the light output from the semiconductor light emitting apparatus can be effectively suppressed.

In addition, the light emission area of the semiconductor light emitting element is confined in the stripe structure, so the semiconductor light emitting element can emit green or blue light with a small beam diameter and divergence angle.

Preferably, the semiconductor light emitting apparatus according to the first aspect of the present invention may also have one or any possible combination of the following additional features (i) to (vi).

(i) The optical resonator may be an external optical resonator containing the semiconductor light emitting element.

(ii) In the case (i), the wavelength selection means may be a band-pass filter provided in the external optical resonator.

(iii) In the case (i), the wavelength selection means may be a grating provided in the external optical resonator.

(iv) In the case (i), the wavelength selection means may be a fiber Bragg grating provided in the external optical resonator.

(v) In the case (i), the wavelength selection means may be a Bragg reflection mirror provided in the external optical resonator.

(vi) The optical resonator may be an internal optical resonator provided inside the semiconductor light emitting element.

(2) According to the second aspect of the present invention, there is provided a semiconductor light emitting apparatus comprising: a semiconductor light emitting element which includes a stripe structure and an active layer made of an InGaN material, and emits first light without laser oscillation; a wavelength selection means which is arranged in an optical path of the first light emitted by the semiconductor light emitting element, and allows output, from the semiconductor light emitting apparatus, of only second light having a selected wavelength included in the first light emitted by the semiconductor light emitting element; an optical detector which detects intensity of the second light, and outputs a detected result; and an output regularizing unit which drives the semiconductor light emitting element based on the detected result so as to regularize the intensity of the second light.

The regularization of the intensity of the second light means that the intensity of the second light detected by the optical detector corresponding to an arbitrary level (or value) of a driving signal is maintained constant, i.e., the intensity of the light output from the semiconductor light emitting apparatus corresponding to an arbitrary level (or value) of a driving signal is maintained constant, where the driving signal is supplied from the outside of the semiconductor light emitting apparatus for manipulating the intensity of the optical output of the semiconductor light emitting apparatus.

Since the wavelength selection means is provided in the optical path of the first light emitted by the semiconductor light emitting element, only the second light having a selected wavelength included in the first light emitted by the semiconductor light emitting element is output from the semiconductor light emitting apparatus. Therefore, the variation in the wavelength of the light output from the semiconductor light emitting apparatus can be suppressed. However, in the case where only the wavelength selection means is provided, the intensity of the second light which is allowed to be output from the semiconductor light emitting apparatus varies when the spectrum of the first light emitted from the semiconductor light emitting element varies. Therefore, such a semiconductor light emitting apparatus cannot be used in the aforementioned optical-scanning color image printing apparatuses due to the variation of the intensity.

Nevertheless, since the optical detector and the output regularizing unit are provided in the semiconductor light emitting apparatus according to the second aspect of the present invention, the output regularizing unit drives the semiconductor light emitting element, based on the intensity of the second light detected by the optical detector, so as to control the intensity of the second light to be maintained constant for an arbitrary level of the driving signal. That is, the variation of the intensity of the light output from the semiconductor light emitting apparatus can also be suppressed. Therefore, the light output from the semiconductor light emitting apparatus according to the second aspect of the present invention can be used in applications in which light having a stabilized wavelength and intensity is required.

Preferably, the semiconductor light emitting apparatus according to the second aspect of the present invention may also have one or any possible combination of the following additional features (vii) to (xii).

(vii) The output regularizing unit may comprise an automatic power control circuit.

(viii) The wavelength selection means may be a band-pass filter formed on an optical output end surface of the semiconductor light emitting element.

(ix) In the case (viii), the band-pass filter may be made of an optical multilayer thin film.

(x) In the case (viii), the band-pass filter may include an optical absorption material.

(xi) In the cases (viii) to (x), the optical output end surface may be inclined at a certain angle away from a plane perpendicular to a direction in which the stripe structure is arranged, and the certain angle may be equal to or greater than one degree.

(xii) The wavelength selection means may be a band-pass filter arranged separately from the semiconductor light emitting element.

The semiconductor light emitting apparatuses according to the first and second aspects of the present invention can realize a light source which can emit light in the visible short wavelength range including the green and blue wavelengths with a small beam diameter and divergence angle, and the wavelength of the emitted light does not vary. Therefore, the semiconductor light emitting apparatuses according to the first and second aspects of the present invention can be used in recording (printing or reproducing) a color image by using light of the three primary colors, i.e., red, green, and blue, exposure of high gradation silver halide photographs, laser display apparatuses, and the like.

Further, the semiconductor light emitting apparatuses according to the first and second aspects of the present invention can replace the conventional light sources in various fields in which laser is used. A typical example of such a field is fluorometric analysis, where a gas laser is conventionally used as an excitation light source.

DESCRIPTION OF THE DRAWINGS

FIG. 4 is a plan view illustrating an outline of the construction of the semiconductor light emitting apparatus as the second embodiment of the present invention.

FIG. 5 is a plan view illustrating an outline of the construction of the semiconductor light emitting apparatus as the third embodiment of the present invention.

FIG. 6 is a plan view illustrating an outline of the construction of the semiconductor light emitting apparatus as the fourth embodiment of the present invention.

FIG. 7 is a plan view illustrating an outline of the construction of the semiconductor light emitting apparatus as the fifth embodiment of the present invention.

DESCRIPTION OF PREFERRED EMBODIMENTS

Detailed explanations on various embodiments of the present invention are provided below with reference to drawings.

First Embodiment

Figure 1:
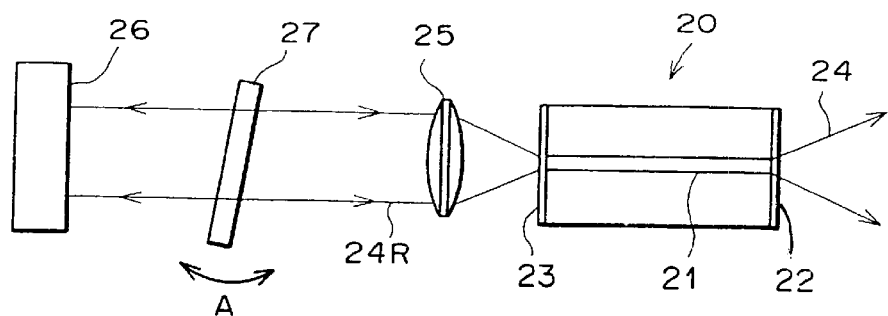
FIG. 1 a plan view illustrating an outline of the construction of the semiconductor light emitting apparatus as the first embodiment of the present invention.
Figure 2:
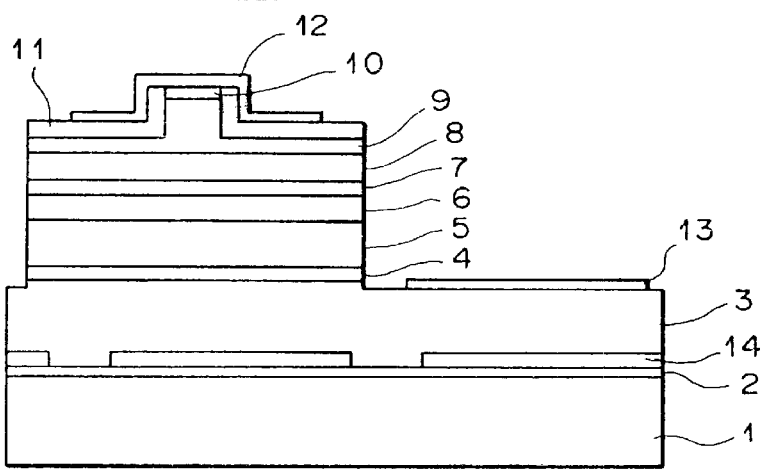
FIG. 2 is a cross-sectional view illustrating a longitudinal section of a semiconductor light emitting element used in the semiconductor light emitting apparatus as the first embodiment of the present invention.

FIG. 1 is a plan view illustrating an outline of the construction of the semiconductor light emitting apparatus as the first embodiment of the present invention, and FIG. 2 is a cross-sectional view illustrating a longitudinal section of a semiconductor light emitting element 20 used in the construction of FIG. 1.

First, the semiconductor light emitting element 20 is explained below with reference to FIG. 2.

The semiconductor light emitting element 20 includes a double heterostructure in which an active layer 7 is sandwiched by cladding layers 5 and 9, a current injection window having a stripe-like shape is provided in a cap layer 10 for confining light, and an optical reflection structure is realized by cleavage planes (as reflection surfaces) of the semiconductor light emitting element.

The construction of the semiconductor light emitting element 20 and a method for producing the semiconductor light emitting element 20 are explained in detail below.

An n-type GaN low-temperature buffer layer 2 is formed on a C face of a sapphire substrate 1 by an MOCVD (metal organic chemical vapor deposition) technique, and then a $SiO_2$ mask 14 having a stripe-like shape is formed. Subsequently, an n-type Si-doped GaN buffer layer 3 having a thickness of 5 micrometers, an n-type Si-doped $In_{0.05}Ga_{0.95}N$ buffer layer 4 having a thickness of 0.1 micrometers, an n-type Si-doped $Al_{0.1}Ga_{0.9}N$ cladding layer 5 having a thickness of 0.5 micrometers, an n-type Si-doped GaN optical waveguide layer 6 having a thickness of 0.1 micrometers, an undoped active layer 7, a p-type Mg-doped GaN optical waveguide layer 8 having a thickness of 0.1 micrometers, a p-type Mg-doped $Al_{0.1}Ga_{0.9}N$ cladding layer 9 having a thickness of 0.5 micrometers, and a p-type Mg-doped GaN cap layer 10 having a thickness of 0.3 micrometers are formed in this order. Thereafter, the p-type impurities are activated by heat treatment in an $N_2$ atmosphere.

The active layer 7 has a triple quantum well structure including an undoped $In_{0.05}Ga_{0.95}N$ layer having a thickness of 10 nanometers, an undoped $In_{0.28}Ga_{0.72}N$ quantum well layer having a thickness of 2.5 nanometers, an undoped $In_{0.05}Ga_{0.95}N$ layer having a thickness of 5 nanometers, an undoped $In_{0.28}Ga_{0.72}N$ quantum well layer having a thickness of 2.5 nanometers, an undoped $In_{0.05}Ga_{0.95}N$ layer having a thickness of 5 nanometers, an undoped $In_{0.28}Ga_{0.72}N$ quantum well layer having a thickness of 2.5 nanometers, an undoped $In_{0.05}Ga_{0.95}N$ layer having a thickness of 5 nanometers, and an undoped $Al_{0.1}Ga_{0.9}N$ layer having a thickness of 10 nanometers. Each quantum well layer has a band gap corresponding to a wavelength of 488 nm.

In order to form a ridge stripe having a width of 6 micrometers, areas other than the ridge stripe area, of the epitaxial layers from the p-type Mg-doped GaN cap layer 10 to a part of the thickness of the p-type Mg-doped $Al_{0.1}Ga_{0.9}N$ cladding layer 9 are removed by reactive ion beam etching (RIBE) using chlorine ions. Next, a SiN film 11 is formed on exposed surfaces including the top surface of the ridge stripe portion, by the plasma CVD technique. Then, in order to form an n electrode, portions of the epitaxial layers other than the light emission area which includes the ridge stripe portion are removed, by photolithography and reactive ion beam etching (RIBE) using chlorine ions, to a depth at which the n-type Si-doped GaN buffer layer 3 is revealed. At the same time, resonator end surfaces are formed.

Thereafter, a stripe-like window, which has a stripe-like shape with a width of 10 micrometers, is formed in the SiN film 11 at the top of the ridge stripe portion for current injection. Next, Ni and Au are deposited by vacuum evaporation so as to cover the stripe-like window and form a p electrode 12, and Ti and Al are deposited by vacuum evaporation on an exposed surface of the n-type Si-doped GaN buffer layer 3. Then, ohmic electrodes are formed by annealing the above construction in $N_2$ atmosphere.

Although laser oscillation does not occur in the above semiconductor light emitting element 20, the optical waveguide structure comprised of the above layer construction and ridge-type index-guided structure, and the optical reflection structure formed by the light output end surfaces realize a superluminescent diode (SLD) which emits a blue light beam having a wavelength of 488 nm by so-called superradiance.

When the above semiconductor light emitting element 20 is combined with an external resonator, it is possible to realize a semiconductor light emitting apparatus in which variation of the wavelength of emitted light can be suppressed, as illustrated in FIG. 1. The construction and operations of the semiconductor light emitting apparatus are explained below with reference to FIG. 1.

$SiO_2$ coatings 22 and 23 are provided on the forward and backward end surfaces of the semiconductor light emitting element 20 so that the $SiO_2$ coating 22 has a reflectance of 20%, and the $SiO_2$ coating 23 has a reflectance of about 5%. In FIG. 1, the forward and backward sides are illustrated in the right and left sides, respectively.

Figure 3:
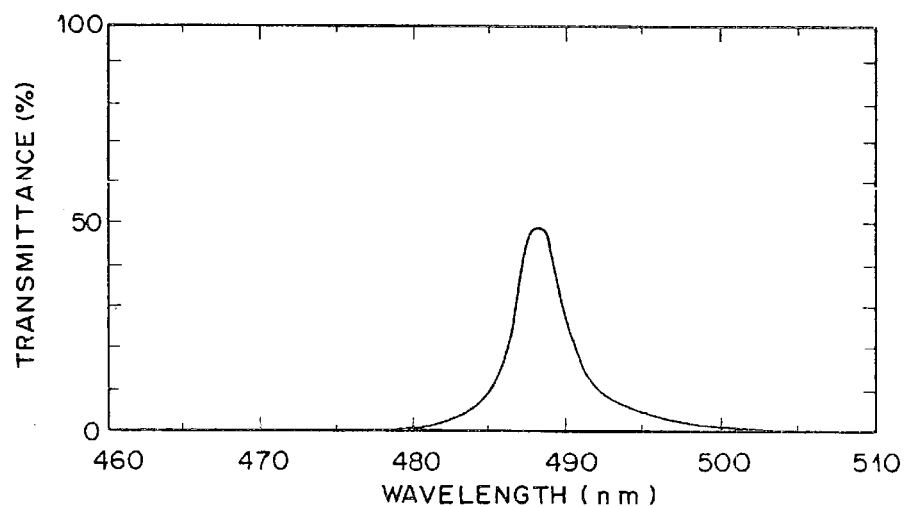
FIG. 3 is a graph indicating a typical spectral transmittance of a band-pass filter used in the semiconductor light emitting apparatus as the first embodiment of the present invention.

In the semiconductor light emitting apparatus of FIG. 1, a collimator lens 25, a mirror 26, and a narrow-band-pass filter 27 are arranged on the backward side of the semiconductor light emitting element 20. The collimator lens 25 collimates backward light 24R output from the semiconductor light emitting element 20. The mirror 26 reflects the collimated backward light 24R to feed it back to the semiconductor light emitting element 20. The narrow-band-pass filter 27 is provided as a wavelength selection element, and arranged between the collimator lens 25 and the mirror 26. The narrow-band-pass filter 27 has a spectral transmittance as illustrated in FIG. 3.

In the construction of FIG. 1, the external resonator is realized by the mirror 26 and the forward end surface of the semiconductor light emitting element 20. The semiconductor light emitting apparatus emits light at the resonant wavelength of the external resonator. Since the wavelength of the backward light 24R is selected by the narrow-band-pass filter 27, the wavelength of the light emitted by the semiconductor light emitting element 20 is locked at the wavelength selected by the narrow-band-pass filter 27. Thus, the wavelength of the blue light output from the forward end of the semiconductor light emitting element 20 is locked to a certain wavelength for use in a desired application. If the above external resonator including the narrow-band-pass filter 27 is not provided, the wavelength of the light emitted by the semiconductor light emitting element 20 shifts to the shorter wavelength side with increase in the driving current.

In this example, the transmitted wavelength of the narrow-band-pass filter 27 is determined corresponding to a wavelength of light emitted by the semiconductor light emitting element 20 when the external resonator is not provided, and the semiconductor light emitting element 20 is driven by a current in an actually used current range. Since the transmitted wavelength of the narrow-band-pass filter 27 varies with the rotation angle (angular position) of the narrow-band-pass filter 27 (as indicated by the arrows A in FIG. 1), the wavelength of the light emitted by the semiconductor light emitting apparatus of FIG. 1 can be determined (and locked) by positioning the narrow-band-pass filter 27 at an appropriate angular position.

In the above semiconductor light emitting element 20, optical amplification occurs at an energy corresponding to the selected wavelength. Therefore, an emission spectrum having an extremely narrow peak can be obtained without a wavelength shift. Since the semiconductor light emitting element 20 is a superluminescent diode (SLD), the emission spot has a small size of several nanometers, and the beam divergence angle indicated by full angle at half maximum is at most about 20 degrees in the horizontal plane, and at most about 50 degrees in the vertical plane.

Although the above explanation is provided for the case where the wavelength of light emitted from the semiconductor light emitting element 20 is 488 nm, the semiconductor light emitting element 20 can emit light having an arbitrary wavelength in a wide wavelength range of about 430 to 600 nm when the relative composition of Indium in the InGaN active layer and the transmitted wavelength in the external resonator are appropriately set.

Second Embodiment

FIG. 4 is a plan view illustrating an outline of the construction of the semiconductor light emitting apparatus as the second embodiment of the present invention. In FIG. 4, elements having the same reference numbers as FIG. 1 have the same functions as the corresponding elements in FIG. 1.

In the semiconductor light emitting apparatus of FIG. 4, a collimator lens 25 and a reflective-type bulk grating element 30 are arranged on the backward side of the semiconductor light emitting element 20. The collimator lens 25 collimates backward light 24R output from the semiconductor light emitting element 20. The reflective-type bulk grating element 30 reflects the collimated backward light 24R to feed it back to the semiconductor light emitting element 20. In the construction of FIG. 4, an external resonator is realized by the bulk grating element 30 and the forward end surface of the semiconductor light emitting element 20. The bulk grating element 30 realizes a wavelength selection element. Since the wavelength of light reflected by the bulk grating element 30 varies with the rotation angle (angular position) of the bulk grating element 30 (as indicated by the arrows A in FIG. 4), the wavelength of the light emitted by the semiconductor light emitting apparatus of FIG. 4 can be determined and locked at a desired value by positioning the bulk grating element 30 at an appropriate angular position.

Third Embodiment

FIG. 5 is a plan view illustrating an outline of the construction of the semiconductor light emitting apparatus as the third embodiment of the present invention. In FIG. 5, elements having the same reference numbers as FIG. 1 have the same functions as the corresponding elements in FIG. 1.

In the semiconductor light emitting apparatus of FIG. 5, a collimator lens 25, a condenser lens 40, and a fiber Bragg grating 41 are arranged on the backward side of the semiconductor light emitting element 20. The collimator lens 25 collimates backward light 24R output from the semiconductor light emitting element 20. The condenser lens 40 collects the collimated backward light 24R.

The fiber Bragg grating 41 is an optical fiber including a core which is embedded in cladding and has a higher refractive index than the cladding. In the core, a plurality of index varied portions are formed at regular intervals. The backward light 24R collected by the condenser lens 40 converges at an end surface of the fiber Bragg grating 41, enters and propagates through the fiber. The above plurality of index varied portions are arranged in the propagation direction, and function as a (diffraction) grating. The grating diffracts and reflects light of only a specific wavelength corresponding to the period of the grating, from among the light propagating through the core, and feeds the diffracted and reflected light back to the semiconductor light emitting element 20. That is, an external resonator is realized by the grating formed in the fiber Bragg grating 41 and the forward end surface of the semiconductor light emitting element 20. Thus, the wavelength of the light emitted by the semiconductor light emitting apparatus of FIG. 5 can be determined and locked at a desired value by appropriately setting the grating period of the fiber Bragg grating 41.

Fourth Embodiment

FIG. 6 is a plan view illustrating an outline of the construction of the semiconductor light emitting apparatus as the fourth embodiment of the present invention. In FIG. 6, elements having the same reference numbers as FIG. 1 have the same functions as the corresponding elements in FIG. 1.

In the semiconductor light emitting apparatus of FIG. 6, a collimator lens 25, a condenser lens 40, and a Bragg reflection mirror 50 are arranged on the backward side of the semiconductor light emitting element 20. The collimator lens 25 collimates backward light 24R output from the semiconductor light emitting element 20. The condenser lens 40 collects the collimated backward light 24R.

The backward light 24R collected by the condenser lens 40 enters the Bragg reflection mirror 50. The Bragg reflection mirror 50 contains a (diffraction) grating arranged in the propagation direction of the backward light 24R, diffracts and reflects light of only a specific wavelength corresponding to the period of the grating, and feeds the diffracted and reflected light back to the semiconductor light emitting element 20. That is, an external resonator is realized by the grating formed in the Bragg reflection mirror 50 and the forward end surface of the semiconductor light emitting element 20. Thus, the wavelength of the light emitted by the semiconductor light emitting apparatus of FIG. 6 can be determined and locked at a desired value by appropriately setting the grating period of the Bragg reflection mirror 50.

Fifth Embodiment

FIG. 7 is a plan view illustrating an outline of the construction of the semiconductor light emitting apparatus as the fifth embodiment of the present invention. In FIG. 7, elements having the same reference numbers as FIG. 1 have the same functions as the corresponding elements in FIG. 1.

In the semiconductor light emitting apparatus of FIG. 7, a Bragg reflection mirror 50 is directly coupled to the backward end surface of the semiconductor light emitting element 20. The Bragg reflection mirror 50 has the same function as that in the construction of FIG. 6.

The backward light 24R emitted from the backward end surface of the semiconductor light emitting element 20 directly enters the Bragg reflection mirror 50. The Bragg reflection mirror 50 diffracts and reflects light of only a specific wavelength corresponding to the period of the grating, and feeds the diffracted and reflected light back to the semiconductor light emitting element 20. That is, an external resonator is realized by the grating formed in the Bragg reflection mirror 50 and the forward end surface of the semiconductor light emitting element 20. Thus, the wavelength of the light emitted by the semiconductor light emitting apparatus of FIG. 7 can be determined and locked at a desired value by appropriately setting the grating period of the Bragg reflection mirror 50.

Sixth Embodiment

Figure 8:
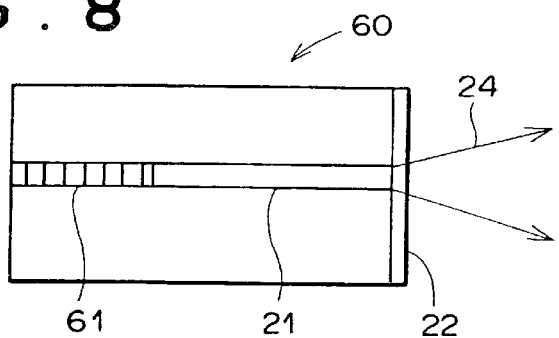
FIG. 8 is a plan view illustrating an outline of the construction of the semiconductor light emitting apparatus as the sixth embodiment of the present invention.

FIG. 8 is a plan view illustrating an outline of the construction of the semiconductor light emitting apparatus as the sixth embodiment of the present invention.

The semiconductor light emitting apparatus of FIG. 8 is realized by a semiconductor light emitting element 60, which is identical with the semiconductor light emitting element 20 except that a distributed Bragg reflector (DBR) 61 is formed along the stripe portion 21 of the semiconductor light emitting element 60. That is, an internal resonator is realized by the distributed Bragg reflector (DBR) 61 and the forward end surface of the semiconductor light emitting element 60.

Figure 9:
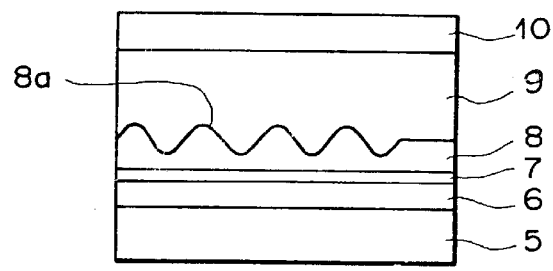
FIG. 9 is a fragmentary cross-sectional view illustrating a portion of a longitudinal section of a semiconductor light emitting element used in the semiconductor light emitting apparatus as the sixth embodiment of the present invention.

FIG. 9 is a fragmentary cross-sectional view illustrating a portion of the semiconductor light emitting element 60 in which the distributed Bragg reflector (DBR) 61 is formed. As illustrated in FIG. 9, a grating 8a having a predetermined period is formed in the optical waveguide layer 8 along the active layer 7. The distributed Bragg reflector (DBR) 61 diffracts and reflects light of only a specific wavelength corresponding to the period of the grating 8a. Thus, the wavelength of the light emitted by the semiconductor light emitting apparatus of FIG. 8 can be determined and locked at a desired value by appropriately setting the period of the grating 8a.

Seventh Embodiment

Figure 10:
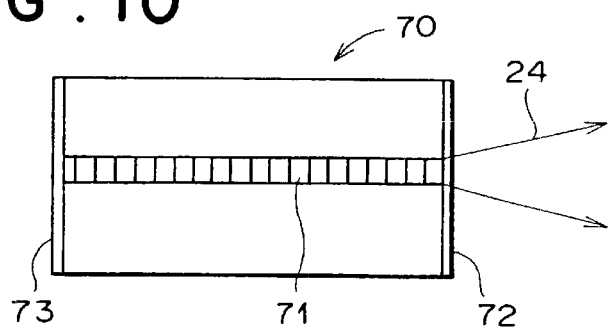
FIG. 10 is a plan view illustrating an outline of the construction of the semiconductor light emitting apparatus as the seventh embodiment of the present invention.

FIG. 10 is a plan view illustrating an outline of the construction of the semiconductor light emitting apparatus as the seventh embodiment of the present invention.

The semiconductor light emitting apparatus of FIG. 10 is realized by a semiconductor light emitting element 70, which is identical with the semiconductor light emitting element 20 except that a distributed Bragg reflector (DBR) 71 is formed along the entire length of the stripe portion of the semiconductor light emitting element 70, and an internal resonator is realized by the distributed Bragg reflector (DBR) 71. The distributed Bragg reflector (DBR) 71 is formed in a similar manner to that in the construction of FIG. 9. Antireflection coatings 72 and 73 are provided on the forward and backward end surfaces of the semiconductor light emitting element 70. The distributed Bragg reflector (DBR) 71 diffracts and reflects light of only a specific wavelength corresponding to the period of the grating. Thus, the wavelength of the light emitted by the semiconductor light emitting apparatus of FIG. 10 can be determined and locked at a desired value by appropriately setting the period of the grating.

Figure 11:
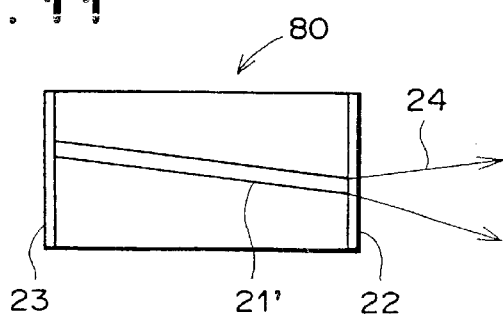
FIG. 11 is a plan view illustrating an outline of the construction of a semiconductor light emitting element which can be used in the present invention.

Although, in the first to seventh embodiments, the stripe portion in the semiconductor light emitting element is formed along the direction perpendicular to the forward and backward end surfaces of the semiconductor light emitting element, it is possible to use a semiconductor light emitting element 80 in which the stripe portion is formed in a slanting direction with respect to the forward and backward end surfaces of the semiconductor light emitting element, as illustrated in FIG. 11. Since the stripe portion 21' is inclined with respect to the forward and backward end surfaces of the semiconductor light emitting element, reflectances of emitted light at the end surfaces are lowered.

Eighth Embodiment

Figure 12:
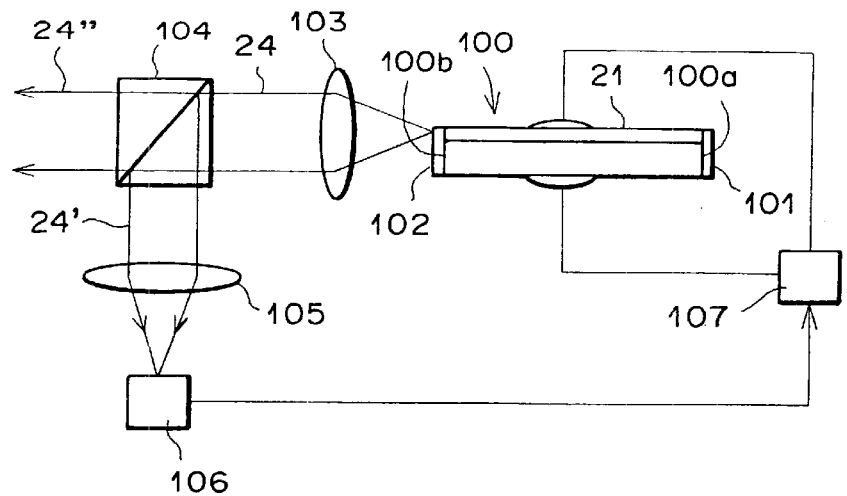
FIG. 12 is a side view illustrating an outline of the construction of the semiconductor light emitting apparatus as the eighth embodiment of the present invention.
Figure 13:
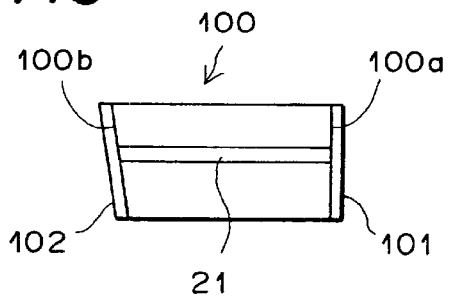
FIG. 13 is a plan view illustrating an outline of the construction of a semiconductor light emitting element used in the construction of FIG. 12.

FIG. 12 is a side view illustrating an outline of the construction of the semiconductor light emitting apparatus as the eighth embodiment of the present invention, and FIG. 13 is a plan view illustrating a semiconductor light emitting element 100 used in the construction of FIG. 12.

The semiconductor light emitting element 100 of FIG. 13 is the same as the semiconductor light emitting element 20 of FIG. 2 except for the active layer. The active layer of the semiconductor light emitting element 100 of FIG. 13 has a triple quantum well structure including an undoped $In_{0.05}Ga_{0.95}N$ layer having a thickness of 10 nanometers, an undoped $In_{0.28}Ga_{0.72}N$ quantum well layer having a thickness of 2.5 nanometers, an undoped $In_{0.05}Ga_{0.95}N$ layer having a thickness of 5 nanometers, an undoped $In_{0.28}Ga_{0.72}N$ quantum well layer having a thickness of 2.5 nanometers, an undoped $In_{0.05}Ga_{0.95}N$ layer having a thickness of 10 nanometers, an undoped $In_{0.28}Ga_{0.72}N$ quantum well layer having a thickness of 2.5 nanometers, an undoped $In_{0.05}Ga_{0.95}N$ layer having a thickness of 5 nanometers, and an undoped $Al_{0.1}Ga_{0.9}N$ layer having a thickness of 10 nanometers. Each quantum well layer has a band gap corresponding to a wavelength of 488 nm.

The backward surface 100*a* of the semiconductor light emitting element 100 is perpendicular to the stripe portion 21, and a multilayer coating 101 is provided on the backward surface 100*a*, where the multilayer coating 101 is made of, for example, $SiO_2$ and $TiO_2$, and has a reflectance of about 90%. The forward surface 100*b* of the semiconductor light emitting element 100 is inclined at five degrees away from the plane which is perpendicular to the stripe portion 21, and an optical multilayer thin film coating is provided as a narrow-band-pass filter 102 on the backward surface 100*b*, where the narrow-band-pass filter 102 has a similar spectral transmittance to that of the narrow-band-pass filter 27 used in the first embodiment, as illustrated in FIG. 3. Instead of the above optical multilayer thin film coating, various coatings, e.g., coatings containing an optical absorption material such as a dye, can be provided so as to realize a narrow-band-pass filter.

The semiconductor light emitting element 100 having the above construction also functions as a superluminescent diode (SLD), and emits a blue light beam having a wavelength of 488 nm. In addition, an emission spectrum having an extremely narrow peak can be obtained from the semiconductor light emitting element 100. As advantageous characteristics of the superluminescent diode (SLD), the emission spot has a size of several nanometers, and the beam divergence angle indicated by full angle at half maximum is at most about 20 degrees in the horizontal plane, and at most about 50 degrees in the vertical plane. Further, when the relative composition of Indium in the InGaN active layer is appropriately selected, the semiconductor light emitting element 100 can emit light of an arbitrary wavelength in the wavelength range of about 430 to 600 nm.

Since the optical multilayer thin film coating is provided on the forward end surface 100*b* of the semiconductor light emitting element 100 in this embodiment, the forward end surface 100*b* is inclined in order to reduce the influence of a spectrum of reflection by the optical multilayer thin film coating, on the stimulated emission in the semiconductor light emitting element 100. Due to the inclination of the forward end surface 100*b*, coupling of light reflected by the optical multilayer thin film coating to the stripe portion 21 can be minimized. Consequently, even if the reflectance of the optical multilayer thin film coating is reduced at a specific wavelength, light emission is not affected by the reduction of reflectance. Instead of the inclination of the forward end surface 100*b*, the stripe potion 21 may be formed in a slanting direction with respect to the forward end surface of the semiconductor light emitting element, as illustrated in FIG. 11.

The construction and operations of the semiconductor light emitting apparatus of FIG. 12 are explained below.

The semiconductor light emitting apparatus of FIG. 12 comprises the above semiconductor light emitting element 100, a collimator lens 103, a beam splitter 104, a condenser lens 105, an optical detector 106, and an automatic power control (APC) circuit 107. The semiconductor light emitting element 100 emits a divergent light beam, and the collimator lens 103 collimates the divergent light beam. The beam splitter 104 reflects a portion 24' of the collimated light beam 24, and passes the remaining portion 24". The condenser lens 105 collects the reflected portion 24' of the collimated light beam 24, and the optical detector 106 detects the collected light beam 24'. For example, the optical detector 106 is realized by a photodiode. The automatic power control (APC) circuit 107 drives the semiconductor light emitting element 100 based on the output signal of the optical detector 106.

If the narrow-band-pass filter 102 is not provided, the wavelength of the light emitted from the semiconductor light emitting element 100 shifts to a shorter wavelength side with increase in the driving current. However, in the semiconductor light emitting element 100, a wavelength of the light emitted from the semiconductor light emitting element 100 can be selected as a transmitted wavelength of the narrow-band-pass filter 102. Therefore, it is possible to limit the wavelength of the light emitted from the semiconductor light emitting element 100 to an extremely narrow range.

Nevertheless, when the spectrum of the light emitted from the semiconductor light emitting element 100 varies, the transmittance in the narrow-band-pass filter 102 varies accordingly. Therefore, even when the driving current of the semiconductor light emitting element 100 is varied in order to vary the light intensity of the semiconductor light emitting element 100, sometimes the variation in the driving current may not be simply reflected in the intensity of the light emitted from the semiconductor light emitting element 100. In addition, the wavelength and the intensity of the emitted light may vary due to variation in ambient temperature. That is, the intensity of the light emitted from the semiconductor light emitting element 100 may vary due to various causes.

Therefore, in the construction of FIG. 12, the semiconductor light emitting element 100 is driven by the automatic power control (APC) circuit 107 so that the intensity of the light detected by the optical detector 106 is regularized, i.e., the intensity of the light detected by the optical detector 106 corresponding to an arbitrary level of the driving signal is maintained constant, and is not affected by the above-mentioned causes of variation. Thus, the intensity of the light beam 24 emitted from the semiconductor light emitting element 100 is regularized, and the intensity of the light output from the semiconductor light emitting apparatus of FIG. 12 is also regularized.

Ninth Embodiment

Figure 14:
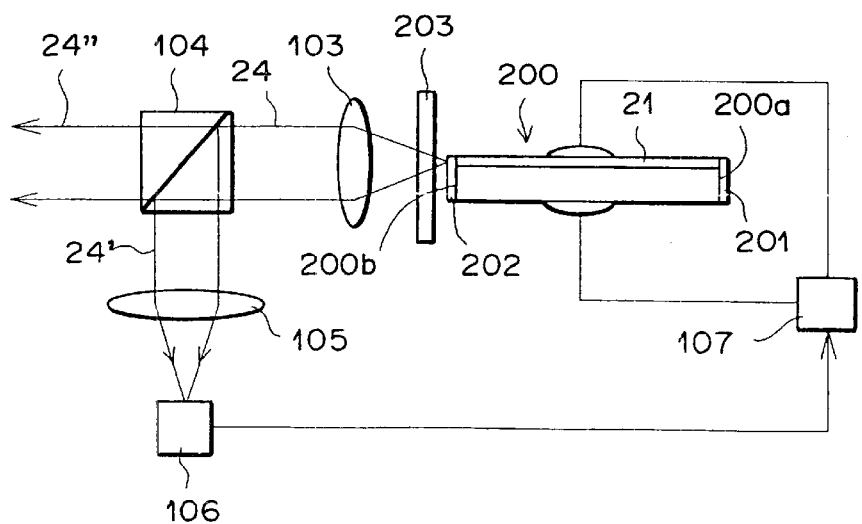
FIG. 14 is a side view illustrating an outline of the construction of the semiconductor light emitting apparatus as the ninth embodiment of the present invention.
Figure 15:
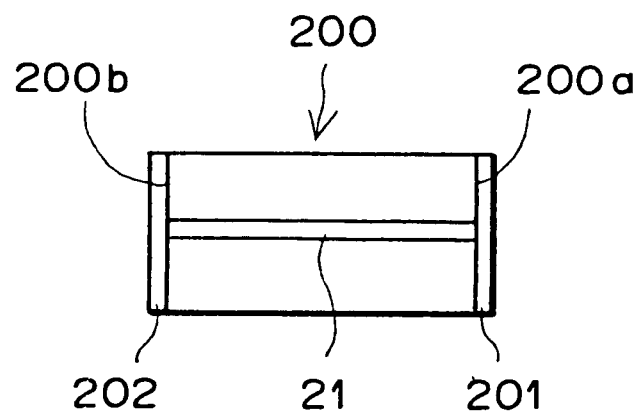
FIG. 15 is a plan view illustrating a semiconductor light emitting element used in the construction of FIG. 14.

FIG. 14 is a side view illustrating an outline of the construction of the semiconductor light emitting apparatus as the ninth embodiment of the present invention, and FIG. 15 is a plan view illustrating a semiconductor light emitting element 200 used in the construction of FIG. 14.

The semiconductor light emitting element 200 of FIG. 15 has basically the same layer construction as that of the semiconductor light emitting element 100 illustrated in FIG. 13.

As illustrated in FIG. 15, the backward surface 200*a* of the semiconductor light emitting element 200 is perpendicular to the stripe portion 21, and a multilayer coating 201 is provided on the backward surface 200*a*, where the multilayer coating 101 is made of, for example, $SiO_2$ and $TiO_2$, and has a reflectance of about 90%. The forward surface 200b of the semiconductor light emitting element 200 is also perpendicular to the stripe portion 21, and a single layer coating 202 is provided on the backward surface 200b, where the single layer coating 202 is made of, for example, $SiO_2$, and has a reflectance of about 24%.

The construction and operations of the semiconductor light emitting apparatus of FIG. 14 are explained below.

The semiconductor light emitting apparatus of FIG. 14 comprises the above semiconductor light emitting element 200, a narrow-band-pass filter 203, a collimator lens 103, a beam splitter 104, a condenser lens 105, an optical detector 106, and an automatic power control (APC) circuit 107. The semiconductor light emitting element 200 emits a divergent light beam, and the collimator lens 103 collimates the divergent light beam.

The collimator lens 103, the beam splitter 104, the condenser lens 105, the optical detector 106, and the automatic power control (APC) circuit 107 have the same functions as the elements having the same reference numbers in FIG. 12.

The narrow-band-pass filter 203 is arranged in the path of the light emitted from the semiconductor light emitting element 200, and has a similar spectral transmittance to that of the narrow-band-pass filter 27 used in the first embodiment as illustrated in FIG. 3. Therefore, the semiconductor light emitting apparatus in FIG. 14 has the same functions and advantages as those of the semiconductor light emitting apparatus illustrated in FIG. 12.

Figure 16:
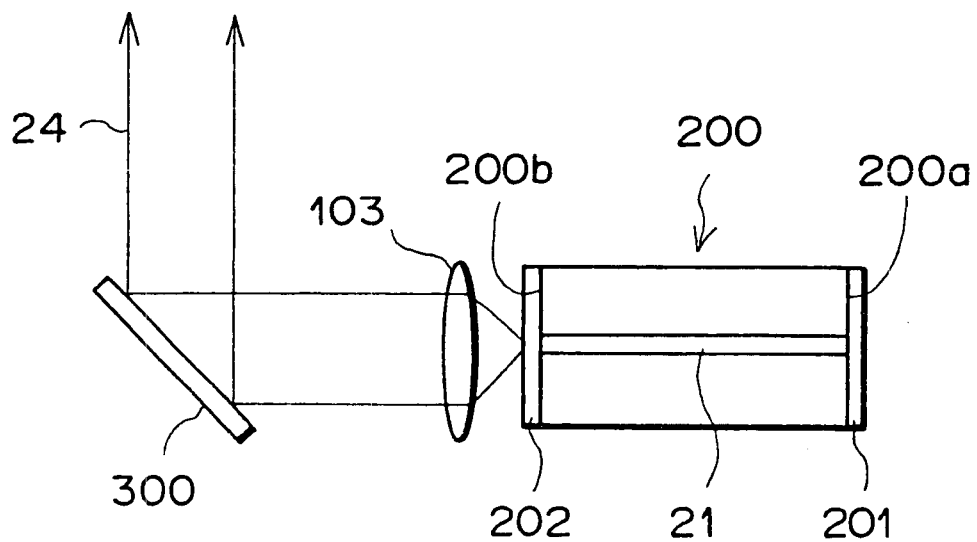
FIG. 16 is a side view illustrating a portion of a semiconductor light emitting apparatus in which a reflection type wavelength selection mirror is used a wavelength selection means.

Although the transmission type narrow-band-pass filters 102 and 203 are used in the eighth and ninth embodiments, it is possible to use a reflection type wavelength selection mirror 300 as briefly illustrated in FIG. 16, instead of the transmission type narrow-band-pass filter. In this case, the construction comprised of the beam splitter 104, the condenser lens 105, the optical detector 106, and the automatic power control (APC) circuit 107 can also be used for regularizing the intensity of the light.

In addition, all of the contents of the Japanese patent application, Nos.11(1999)-185019 and 2000-119344 are incorporated into this specification by reference.

What is claimed is:

1. A semiconductor light emitting apparatus comprising:
   a semiconductor light emitting element which includes a stripe structure and an active layer which is made of an InGaN material, and emits first light without laser oscillation;
   a wavelength selection means which is arranged in an optical path of said first light emitted by said semiconductor light emitting element, and allows output, from said semiconductor light emitting apparatus, of only second light having a selected wavelength included in said first light emitted by said semiconductor light emitting element;
   an optical detector which detects intensity of said second light, and outputs a detected result; and
   an output regularizing unit which drives said semiconductor light emitting element based on said detected result so as to regularize said intensity of said second light.

2. A semiconductor light emitting apparatus according to claim 1, wherein said output regularizing unit comprises an automatic power control circuit.

3. A semiconductor light emitting apparatus according to claim 1, wherein said semiconductor light emitting element has an optical output end surface, and said wavelength selection means is a band-pass filter formed on said optical output end surface.

4. A semiconductor light emitting apparatus according to claim 3, wherein said band-pass filter is made of an optical multilayer thin film.

5. A semiconductor light emitting apparatus according to claim 3, wherein said band-pass filter includes an optical absorption material.

6. A semiconductor light emitting apparatus according to claim 3, wherein said optical output end surface is inclined at a certain angle away from a plane perpendicular to a direction in which said stripe structure is arranged, and said certain angle is equal to or greater than one degree.

7. A semiconductor light emitting apparatus according to claim 4, wherein said optical output end surface is inclined at a certain angle away from a plane perpendicular to a direction in which said stripe structure is arranged, and said certain angle is equal to or greater than one degree.

8. A semiconductor light emitting apparatus according to claim 5, wherein said optical output end surface is inclined at a certain angle away from a plane perpendicular to a direction in which said stripe structure is arranged, and said certain angle is equal to or greater than one degree.

9. A semiconductor light emitting apparatus according to claim 1, wherein said wavelength selection means is a band-pass filter arranged separately from said semiconductor light emitting element.

* * * * *